United States Patent
Glass et al.

(10) Patent No.: US 9,653,584 B2
(45) Date of Patent: May 16, 2017

(54) PRE-SCULPTING OF SI FIN ELEMENTS PRIOR TO CLADDING FOR TRANSISTOR CHANNEL APPLICATIONS

(71) Applicant: Intel Corporation, Santa Clara, CA (US)

(72) Inventors: Glenn A. Glass, Beaverton, OR (US); Anand S. Murthy, Portland, OR (US); Daniel B. Aubertine, North Plains, OR (US); Subhash M. Joshi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/037,644

(22) PCT Filed: Dec. 23, 2013

(86) PCT No.: PCT/US2013/077593
§ 371 (c)(1),
(2) Date: May 18, 2016

(87) PCT Pub. No.: WO2015/099680
PCT Pub. Date: Jul. 2, 2015

(65) Prior Publication Data
US 2016/0308032 A1    Oct. 20, 2016

(51) Int. Cl.
*H01L 21/336* (2006.01)
*H01L 29/66* (2006.01)
(Continued)

(52) U.S. Cl.
CPC ...... *H01L 29/66818* (2013.01); *H01L 21/304* (2013.01); *H01L 21/30604* (2013.01);
(Continued)

(58) Field of Classification Search
CPC ............. H01L 21/304; H01L 21/30604; H01L 29/66818; H01L 29/785
(Continued)

(56) References Cited

U.S. PATENT DOCUMENTS 7,250,645 B1    7/2007    Wang et al.
2007/0111439 A1    5/2007    Jung et al.
(Continued)

FOREIGN PATENT DOCUMENTS

JP    2010-258443    11/2010

OTHER PUBLICATIONS

Intel Corporation, International Search Report for PCT/US2013/077593, dated Sep. 23, 2014.
(Continued)

*Primary Examiner* — David S Blum
(74) *Attorney, Agent, or Firm* — Blakely, Sokoloff, Taylor & Zafman LLP

(57) ABSTRACT

Transistor fin elements (e.g., fin or tri gate) may be modified by radio frequency (RF) plasma and/or thermal processing for purpose of dimensional sculpting. The etched, thinned fins may be formed by first forming wider single crystal fins, and after depositing trench oxide material between the wider fins, etching the wider fins using a second etch to form narrower single crystal fins having undamaged top and sidewalls for epitaxially growing active channel material. The second etch may remove a thickness of between a 1 nm and 15 nm of the top surfaces and the sidewalls of the wider fins. It may remove the thickness using (1) chlorine or fluorine based chemistry using low ion energy plasma processing, or (2) low temperature thermal processing that does not damage fins via energetic ion bombardment, oxidation or by leaving behind etch residue that could disrupt the epitaxial growth quality of the second material.

14 Claims, 9 Drawing Sheets

(51) Int. Cl.
    *H01L 29/78*       (2006.01)
    *H01L 21/304*     (2006.01)
    *H01L 21/306*     (2006.01)
    *H01L 27/105*     (2006.01)
    *H01L 29/04*       (2006.01)

(52) U.S. Cl.
    CPC ............ *H01L 27/105* (2013.01); *H01L 29/04* (2013.01); *H01L 29/66795* (2013.01); *H01L 29/785* (2013.01)

(58) Field of Classification Search
    USPC ........................................................ 438/300
    See application file for complete search history.

(56) References Cited

U.S. PATENT DOCUMENTS

2010/0252816 A1    10/2010    Ko et al.
2011/0180847 A1      7/2011    Ikeda et al.
2013/0307038 A1    11/2013    Toh et al.

OTHER PUBLICATIONS

"International Preliminary Report on Patentability and Written Opinion of the International Searching Authority", mailed Jul. 7, 2016, PCT/US2013/077593.

Intel Corporation, "Non-Final Office Action and Taiwan IPO Search Report", Taiwan Application No. 103140473, (Nov. 1, 2016).

US 9,653,584 B2

PRE-SCULPTING OF SI FIN ELEMENTS PRIOR TO CLADDING FOR TRANSISTOR CHANNEL APPLICATIONS

CROSS-REFERENCE TO RELATED APPLICATION

This patent application is a U.S. National Phase Application under 35 U.S.C. §371of International Application No. PCT/US2013/077593, filed Dec. 23, 2013, entitled PRE-SCULPTING OF SI FIN ELEMENTS PRIOR TO CLADDING FOR TRANSISTOR CHANNEL APPLICATIONS.

BACKGROUND

Field

Circuit devices and the manufacture and structure of fin based circuit devices.

Description of Related Art

Increased performance in and yield of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of fin based metal oxide semiconductor (MOS) transistor devices, such as those used in a complementary metal oxide semiconductor (CMOS), it is often desired to increase movement of electrons (carriers) in N-type MOS device (n-MOS) channels and to increase movement of positive charged holes (carriers) in P-type MOS device (p-MOS) channels.

A FinFET may be a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin). There are a number of non-trivial issues associated with fabricating such fin-based transistors.

DETAILED DESCRIPTION

Figure 1:
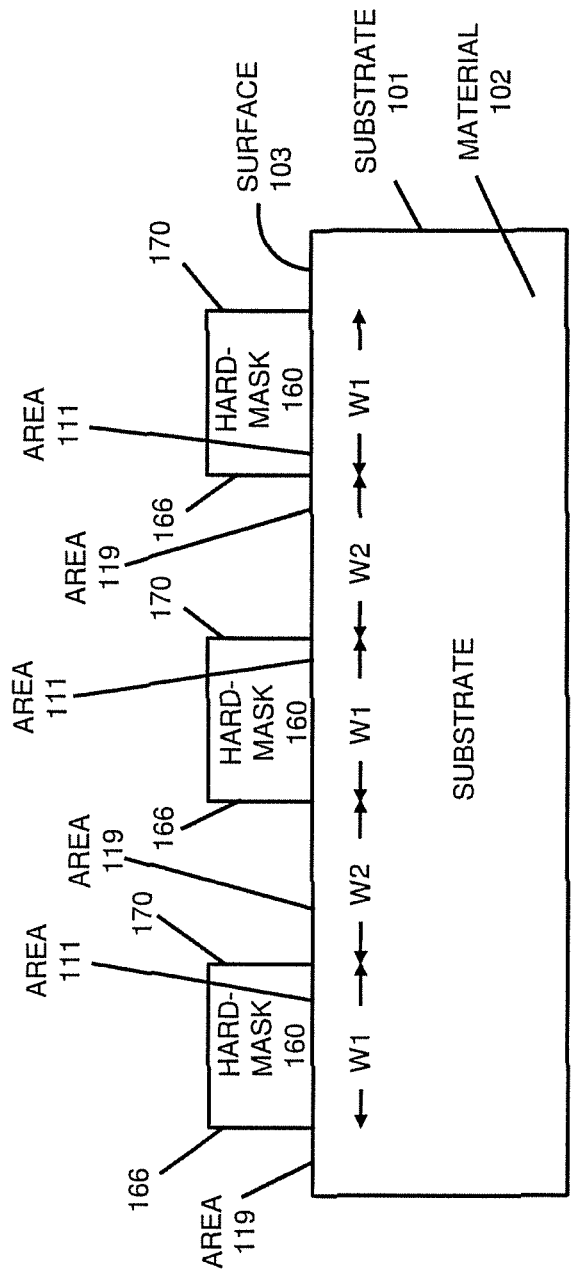
FIG. 1 is a schematic cross section view of a portion of a semiconductor substrate base after forming hardmask patterns on first top surface areas where electronic device fins are desired.

Carrier movement in a fin-based transistor can be increased by a strain in the conductive channel caused at an interface between two materials having a different sized crystal lattice structures. However, performance and movement of the carriers may be slowed by physical size limitations of the fins; as well as lattice mismatches and lattice defects generated at interfaces in a between layers of materials used to form the fins or channels.

In the context of Ge containing cladding layers on a Si fin for fabrication of SiGe alloy and Ge channel transistors it is desirable to minimize the width of the silicon fin layer, in some cases, as much as possible. The Si fin may be a template (e.g., core) for the cladding layer to be deposited upon or grown from (e.g., epitaxially). In some cases, for improved performance properties of the total fin width (Si core plus any cladding layers), the width of the total fin can be less than 20 nm wide, or 30 nm wide. In an embodiment, just the act of reducing the fin width is enough to provide significant improvement in electrostatic properties of the MOS transistor in terms of reduced threshold gate voltage and lower off-state current leakage. In this embodiment, no additional cladding layers are necessary.

In addition, the quality of the cladding layers (e.g., the crystaline structure and therefore performance of the channel cladding layer) may depend on the quality of the Si fin (e.g., its crystaline structure, such as at its top surface and sidewalls) that is used as the starting template for growth. In the context of Ge containing cladding layers on a Silicon fin for fabrication of SiGe alloy and Ge channel fin based transistors it is desirable to avoid or reduce high energy ion bombardment, oxidation and etch residues on Silicon fin surfaces since these are damaging to the quality of subsequently clad or deposited layers. For example, such bombardment, oxidation and etch residues may create defects in or additional material upon the crystaline structure of the silicon fin top and sidewall surfaces upon which the subsequently clad or deposited layers are grown. Consequently, the crystaline structure of the subsequently clad or deposited layer growth will include defects due to the defects in or additional material upon the crystaline structure of the silicon fin top and sidewall surfaces. Thus, avoiding or reducing such bombardment, oxidation and residues increases transistor performance.

To minimize the width of the silicon fin layer and increase the quality of the cladding layers, embodiments herein may form fin transistors (e.g., tri gate) by epitaxially growing a second crystal material on surfaces of etched, thinned first crystal material fins. The etched, thinned fins may be formed by first forming wider single crystal fins having a first width (e.g., using a first etch of single crystal material), that will be subsequently etched (e.g., using a second etch) to form narrower single crystal fins having the same crystal lattice, undamaged top and sidewalls for epitaxially growing a second single crystal material. In some cases the wider single crystal fins are fabricated in industry standard ways via lithographic methods and dry etch. Subsequently, a PMOS device may be formed by cladding a narrower Si fin with a SiGe channel material.

More specifically, according to embodiments herein, wide Si fins may be fabricated in industry standard ways via lithographic methods and dry etch (e.g., a first etch). Then, a second etch may be performed using in-situ methods to reducing the fin width (e.g., to form narrower fins) while avoiding excessive damage to the fin (e.g., top and sidewall surfaces of the etched, narrower fins). This may be accomplished while avoiding additional damage to the fin surfaces and maintaining a clean surfaces that are amenable to high quality epitaxial deposition (e.g., of a cladding channel layer on the top and sidewall surfaces). For example, in some cases, the second etch may be a fin-width trim etch that is outside of (e.g., does not include) the epitaxial deposition toolset (ex-situ) that typically relies on dry etching which can involve high energy ion bombardment, oxidation and etch residues that are all damaging to the quality of subsequently deposited layers.

According to some embodiments, a second etch can be performed to further reduce the width of a Si fin that has already been formed, in order to (1) form a narrow width fin; and (2) provide fin top surface and sidewalls without ion damage, oxidation and residues. In some cases, ion bombardment is the physical process that occurs in the process equipment. Ion damage is the result on the wafer and it means that atoms are knocked out of place meaning that the regular periodic array of atoms in a crystal is disrupted or damaged. This second etch may be performed on existing Si fins to further narrow the portion of the fins exuded above the STI plane. This second etch may be a simultaneous isotropic etching of the top surfaces and the sidewalls of the electronic device fins that does not include high energy ion bombardment, oxidation or etch residues. It may form single crystal (e.g., same crystal lattice as etched surfaces) etched top surfaces and etched sidewalls of electronic device etched fins by etching to remove a thickness of between a 1 nm and 15 nm of the top surfaces and the sidewalls of the electronic device fins. It may be or include etching the top surfaces and the sidewalls of the electronic device fins using any number of methods. We provide examples here including (1) Hydrogen, chlorine or fluorine based chemistry using low ion energy plasma processing, or (2) thermal processing that avoids or does not include energetic ions, oxidation and does not create etch residue that could damage the quality of subsequent deposited layers. It may etch the top surfaces and the sidewalls of the electronic device fins while maintaining the single crystal structure of the top and sidewall surfaces of the device fins. This thermal processing may include HCl or $Cl_2$ containing gas streams in a hydrogen environment at temperatures below 900 C or 700 C respectively.

According to some embodiments, in order to perform in-situ growth of the cladding layer after etching the top surfaces and the sidewalls of the electronic device fins, a second single crystal material is deposited (e.g., grown or formed) on the top and sidewall surfaces of the etched fins, without air break of the processing chamber. The second single crystal material may have a lattice spacing that is different (e.g., larger) than a lattice spacing of the fin single crystal material.

FIG. 1 is a schematic cross section view of a portion of a semiconductor substrate base after forming hardmask patterns on first top surface areas where electronic device fins are desired. FIG. 1 shows semiconductor substrate or base 101 of material 102 having top surface 103. Substrate 101 may include, be formed from, deposited with, or grown from silicon, polycrystalline silicon, single crystal silicon, or various other suitable technologies for forming a silicon base or substrate, such as a silicon single crystal wafer. For example, according to embodiments, substrate 101 may be SOI, bulk Si, float zone or epi Si formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 with a (100) crystal oriented material (e.g., according to Miller Index). Substrate 101 may be a "miscut" substrate.

FIG. 1 shows patterns or masks 160 formed on areas 111 of top surface 103. Masks 160 may be hardmask patterns formed on first top surface areas or locations 111 of a single crystal (e.g., Si) substrate where top surfaces of the electronic device fins are desired. In some cases, mask 160 is formed by or of photoresist alone, or a photoresist/oxide combination; or a photoresist/nitride combination. Mask 160 may have sidewalls 166 and 170 above surface 103. Sidewalls 166 and 170 may be planar surfaces perpendicular to surface 103.

FIG. 1 areas 119 of top surface 103 between masks 160. Areas 119 may be second top surface areas or locations of top surfaces a single crystal (e.g., Si) substrate between or excluding areas 111 where electronic device fins are desired. Areas 119 may be second top surface areas of the substrate between the first top surface areas 111 or between hardmasks 160 where trenches are desired or to be formed substrate 101 (e.g., in surface 103) in between the first top surface areas 111. The trenches may be formed below the second top surface areas 119, such as between locations or areas 111 of the substrate where top surfaces of the electronic device fins are desired.

Areas 111 may have width W1, and length L1 into the page (not shown). In some cases, Areas 111 and masks 160 may have width W1 and Length L1 (not shown but directed into the page of FIG. 1). Areas 119 may be width W2, and length L1 into the page (not shown). Trenches 105 and 106 are formed below top surface areas 119, between locations where areas 111 or top surfaces of electronic device fins are desired.

Figure 2:
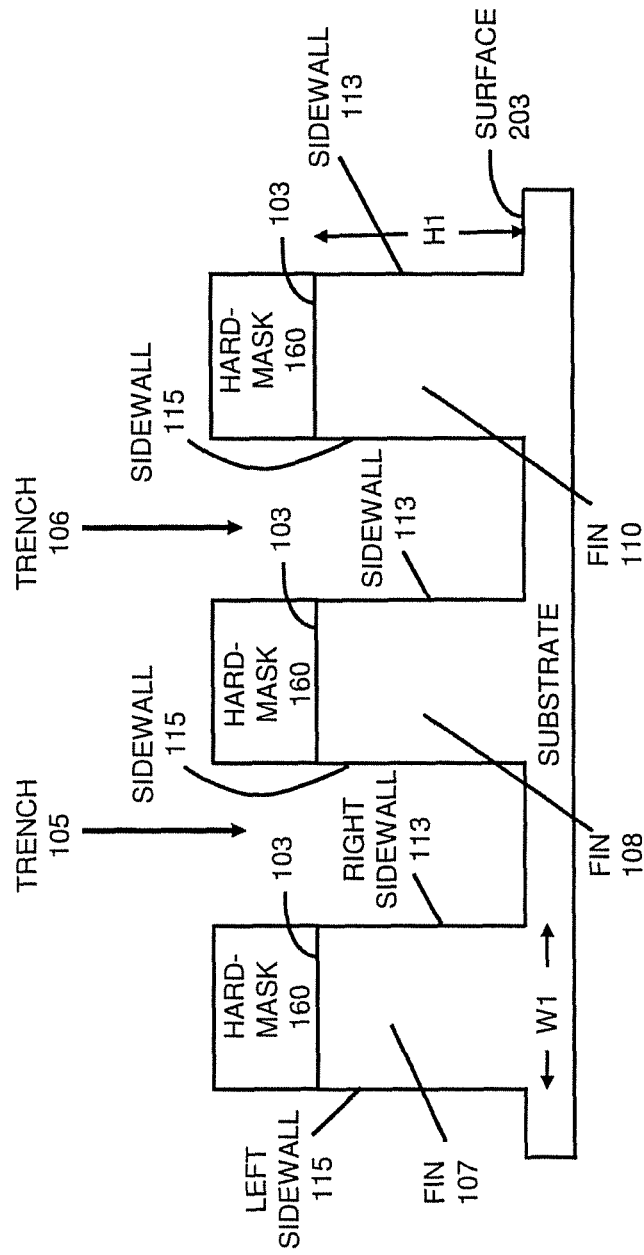
FIG. 2 shows the semiconductor substrate of FIG. 1 after etching a thickness of the substrate between hardmasks to form sidewalls of the electronic device fins and trenches in the between the hardmasks.

FIG. 2 shows the semiconductor substrate of FIG. 1 after etching a thickness of the substrate between hardmasks to form sidewalls of the electronic device fins and trenches in the between the hardmasks. FIG. 2 shows substrate 101 after etching a thickness of material 102 between hard masks 160 or areas 111 to form single crystal sidewalls 113 and 115 of electronic device fins 107, 108 and 110, and to form trenches 105 and 106 between fins 107, 108 and 110. In some cases, this etching may include etching a thickness of material 102 between hard masks 160 or areas 111 to create or form single crystal Silicon top surface 103 and sidewalls 113 and 115 of electronic device fins 107, 108 and 110. Etching material 102 may include etching surface 103 at areas 119 to form the trenches. Etching to form trenches 105 and 106 may include etching height H1 of material 102 and forming surfaces 203, such as bottom surfaces of the trenches, in or below areas 119. Fins 107, 108 and 110 may be described as "wide" or "wider" fins, such as fins that will be further etched to form "narrow" or "narrower" fins as noted herein, such as at least with respect to FIG. 5 and block 850. The etch to form fins 107, 108 and 110, may be described as a "first" etch (e.g., to form the thicker fins), such as where the etch at FIG. 5 (or block 850) is considered a "second" etch to form the narrower fins (e.g., after the first etch).

Etching material 102 may include etching a height H1 of material 102 or substrate 101 to form the trenches and the single crystal sidewalls. Fins 107, 108 and 110 may have height H1 width W1 and length L1, into the page (not shown). Such etching may used a "timed" etch, such as an etch for a period of time known to remove height H1 of material 102; or may use another process that is know to perform such etching. The fins may be or include an "exposed" device well or channel region extending or disposed surface 203. After etching, sidewalls 113 and 115 may be adjacent to sidewalls of mask 160. In some cases, inner sidewalls 113 and 115 may be planar surfaces parallel to and aligned with (e.g., directly below) planar of mask 160.

In some cases, forming fins 407, 408 and 410 include patterning the top surface of a single crystal substrate (e.g. substrate 103) and etching the substrate between the pattern (e.g. masks 160) to form electronic device fins from a height (e.g. H1) of the substrate extending above etched top surfaces 203 of the substrate.

Width W1 may be defined by the horizontal distance between sidewall 113 of region 107 and side at sidewall 115 of region 108. Width W1 may be a width of between 10 and 100 nanometers (nm). In some cases W1 is approximately 25 nm. Width W2 may be a width of between 100 and 1000 nano-meters (nm). Trench 105 may have height H1 defined by the vertical distance between top surface 103 and top surface 117 or 116. Height H1 may be a height of between 30 and 400 nanometers (nm). In some cases H1 is approximately 200 nm. Length L1 may be defined as the length going into the page and along sidewall 113 or sidewall 115. Length L1 may be a length of between 50 nanometers (nm) and 100 micrometers (um). In some cases L1 is approximately 500 nm. In some cases L1 is equal to (or approximately the same as) W1. According to some embodiments, W1 may be between 10 and 15 nanometers (nm) and H1 may be 350 nanometers (nm).

Trenches 105 and 106 may be formed by patterning and etching as known in the art. This may include patterning and etching material 102 to form the trenches. In some cases, patterning and etching material 102 includes using a resist or hard mask (e.g., 160) underneath a resist for the patterning materials. In some cases 1, 2, or 3 resist layers may be used for the patterning materials. In some cases, patterning and etching material 102 to form the trenches includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature.

FIG. 2 shows fins 107, 108 and 110; and trenches 105 and 106 formed in and of substrate 101. However it is contemplated that more, similar fins and trenches may exist on substrate 101 (e.g., such as at least hundreds or millions).

Sidewalls 113 and 115, and surfaces 203 may be subjected to high energy ion bombardment, oxidation, and/or etch residues, depending on the technique used to etch material 102. In some case, the sidewalls and bottom surfaces include crystalline defects that would cause a single crystal material epitaxially grown on them to have defects, and reduced transistor performance if the epitaxially grown material was used as a device channel. If these defects propagate throughout the channel material, they can lead to yield and variations issues in a device built on a device layer formed from epitaxial growth extending above the trench.

Figure 3:
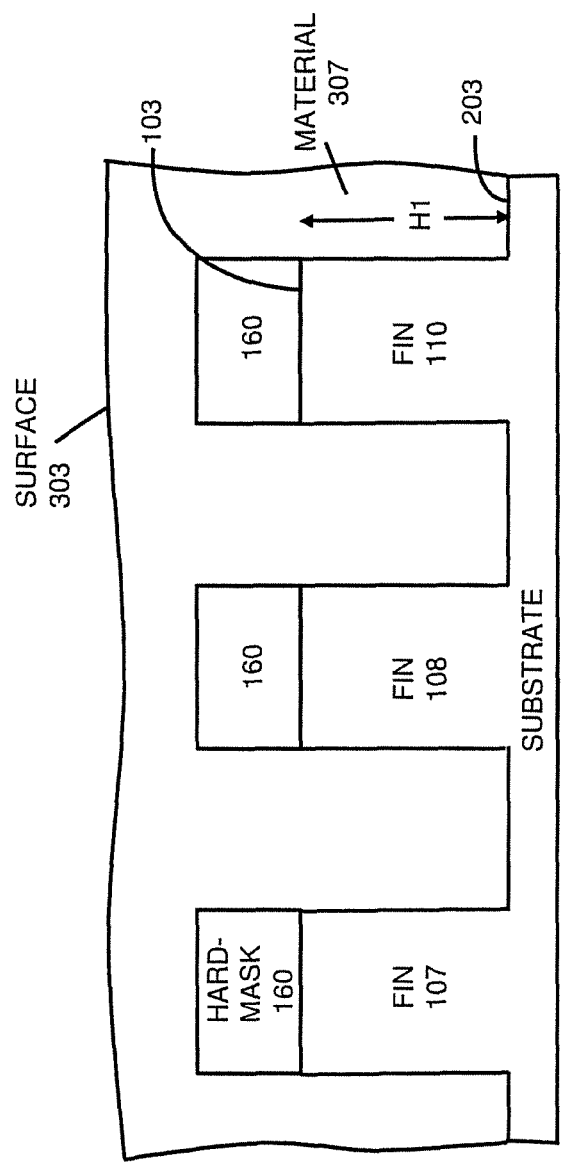
FIG. 3 shows the semiconductor substrate of FIG. 1 after removing the hardmasks to form top surfaces of the fins and depositing a thickness of a trench oxide material in the trenches.

FIG. 3 shows the semiconductor substrate of FIG. 1 after depositing a thickness of a trench oxide material in the trenches. FIG. 3 also shows substrate 101 after depositing a thickness of trench oxide material 307 in trenches 105 and 106; and on masks 160. Material 307 may have surface 303 at or above height H1. Forming material 307 may include depositing or forming a thickness of material 307 in trenches 105 and 106; and on masks 160, up to or above top surfaces 103 of fins 107, 108 and 110.

In some cases, material 307 is a layer of shallow trench isolation (STI) material formed or grown on top surfaces 103, 203 (and optionally sidewalls 113 and 115) of the substrate 101. Material 307 may be formed of an oxide or a nitride or combination thereof. Material 307 may be formed of SiC or another material as know in the art. Material 307 may be formed by atomic layer deposition (ALD) or chemical vapor deposition (CVD). Material 307 is generally deposited via Plasma Enhanced Chemical Deposition (PECVD). In some cases, any of various oxygen precursors, Silane precursors, or generic precursors can be used during a process (e.g., PECVD) to form Material 307, as know in the art. In some cases, Material 307 may be formed by a process using TEOS+O2+RF at 400° C.

Figure 4:
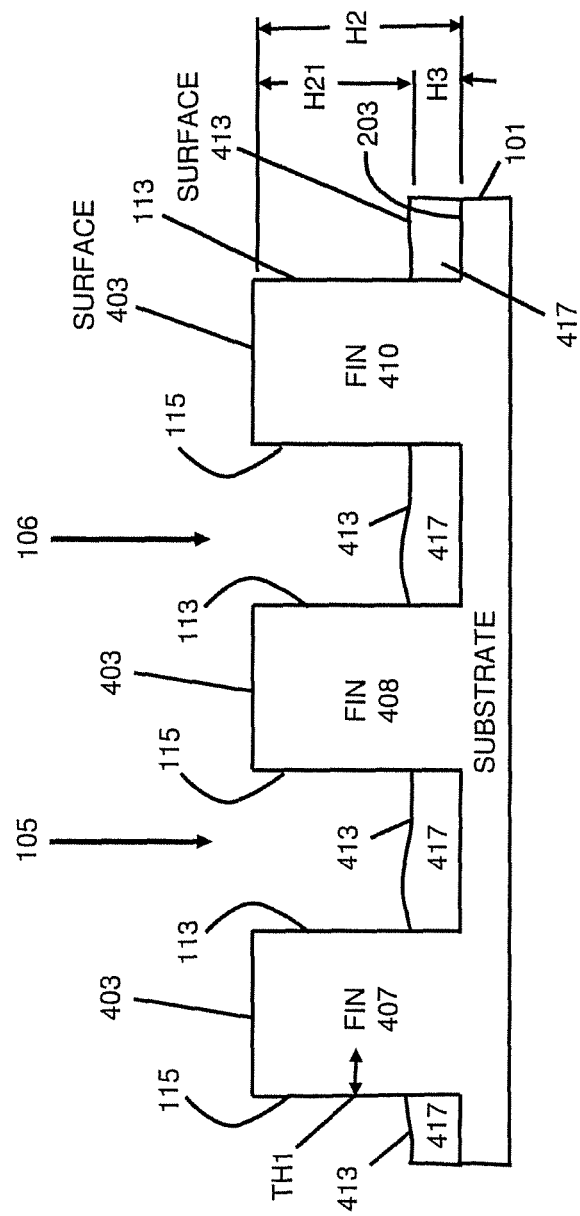
FIG. 4 shows the semiconductor substrate of FIG. 1 after polishing the trench oxide material to the top surfaces of the fins and etching a thickness of the trench oxide material in the trenches to expose the single crystal sidewalls of the electronic device fins.

FIG. 4 shows the semiconductor substrate of FIG. 1 after polishing the trench oxide material and hardmasks to (e.g., to form) the top surfaces of the fins and etching a thickness of the trench oxide material in the trenches to expose the single crystal sidewalls of the electronic device fins. FIG. 4 shows substrate 101 after polishing oxide material 307 to a height of or below the height of surfaces 103 to form top surfaces 403 of fins 407, 408 and 410. Polishing or removing material 307 to form surfaces 403 may include polishing or removing a thickness of material 307 to, or below, height H1 of surface 103. Polishing or removing material 307 to form surfaces 403 may include removing hard masks 160 from surfaces 103, thus forming or exposing top surfaces top surfaces 403 of fins 407, 408 and 410, at height H2, at or from top surfaces 103.

FIG. 4 also shows substrate 101 after etching a thickness of oxide material 307 within trenches 105 and 106 to expose the single crystal sidewalls 113 and 115 of fins 407, 408 and 410 may be similar to fins 107, 108 and 110, except have height H2 instead of height H1, where height H2 is less than or equal to height H1. Material 417 may be top surfaces 413 and height H3 in the trenches. Material 417 may be width W2 and length L1.

In some cases, etching a thickness of the trench oxide material in the trenches removes thickness H2-H3 of the trench oxide in the trenches and exposes height H2-H3 of the single crystal sidewalls 113 and 115 of electronic device fins 407, 408 and 410 to form top surfaces 413 of the trench oxide that are recessed or below the top surfaces 403 of the electronic device fins. Thickness H2-H3 is shown as thickness or height H21, the height that the fin exudes above the STI plane (e.g., surface 413) and this is the region that may become the channel once the device is fully fabricated. Fins 407, 408 and 410 may be described as "wide" or "wider" fins, such as fins that will be further etched to form "narrow" or "narrower" fins as noted herein, such as at least with respect to FIG. 5 and block 850. The etch to form or expose fins 407, 408 and 410, may be described as a "first" etch (e.g., to form the thicker fins), such as where the etch at FIG. 5 (or block 850) is considered a "second" etch to form the narrower fins (e.g., after the first etch).

FIG. 4 shows trench oxide material 417 remaining in trenches 105 and 106. Material 417 may be a remainder of material 307 after etching to remove a height of material 307 in the trenches. Etching material 307 may include etching material 307 at or within areas 119. Etching material 307 to form material 417 may include etching a thickness H21 of material 307, to remove that thickness of material 307 and trenches 105 and 106. This etching may also form top surfaces 413 of material 417 that are recessed or below top surfaces 403 of fins 407, 408 and 410. In some cases, FIG. 4 shows substrate 101 having single crystal silicon fins 407, 408 and 410 with STI material 417 between those fins. In some cases, FIG. 4 may show Si wafer 101 depositing trench oxide 307, polishing oxide 307 and hardmask 160 to the level of the top of the fins at H1, and etching oxide 307 to recess it below the level of the fins to height H3. In some cases, FIG. 4 shows substrate 101 having single crystal silicon fins 407, 408 and 410 with STI material 417 between those fins. The etch may be a selective etch, such as an etch that selectively etches material 307, but does not etch material 102.

According to some embodiments, fins 407, 408 and 410 may be formed, grown or produced by other processes. In some cases, fins 407, 408 and 410 may be grown from a surface of material 102 in trenches formed in a layer of trench oxide material formed on a surface of substrate 101. In some cases, fins 407, 408 and 410 may be formed, grown or produced by processes know in the art. In some cases, fins 407, 408 and 410 may be conventionally patterned Si fins.

Figure 5:
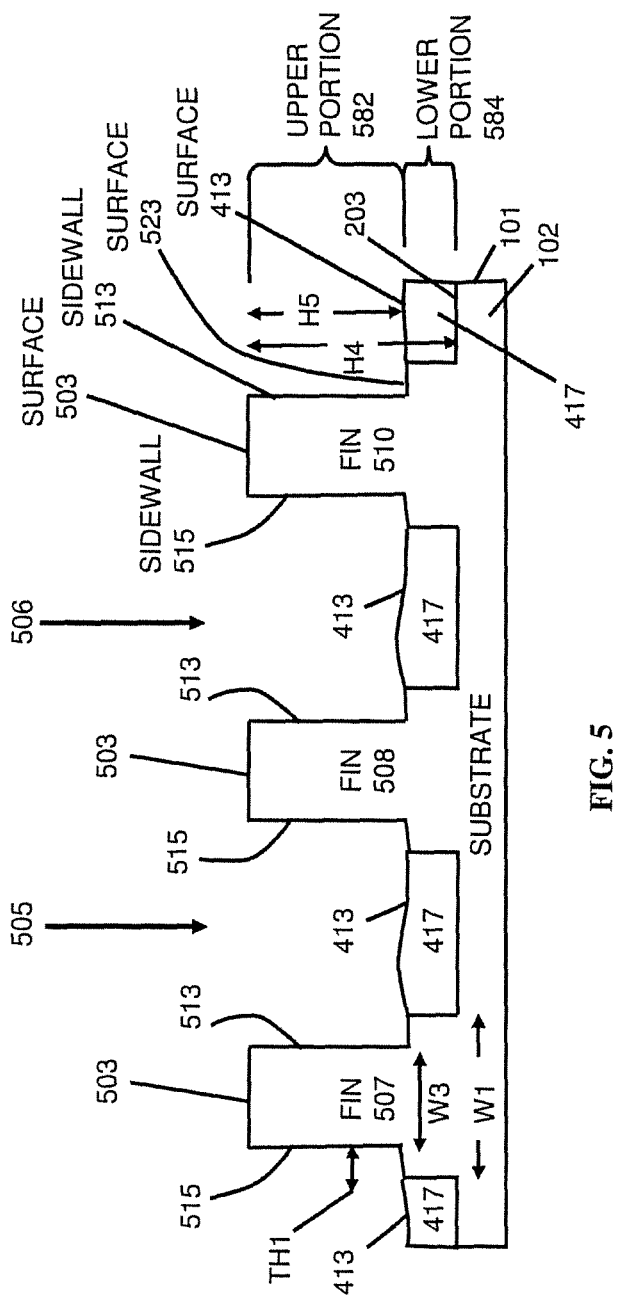
FIG. 5 shows the semiconductor substrate of FIG. 1 after etching the top surfaces and the sidewalls of the electronic device fins to form narrower etched single crystal top surfaces and sidewalls of a narrower etched electronic device fins.

FIG. 5 shows the semiconductor substrate of FIG. 1 after etching the top surfaces and the sidewalls of the electronic device fins to form narrower etched single crystal top surfaces and sidewalls of a narrower etched electronic device fins. FIG. 5 shows substrate 101 after etching top surfaces 403 and sidewalls 113 and 115 of fins 407, 408 and 410 to remove thickness TH2 of material 102 to form "narrower" etched single crystal top surfaces 503 and sidewalls 513 and 515 of narrower etched electronic device fins 507, 508 and 510. This etch may include forming fins 507, 508 and 510 having width W3, which is (e.g., extends in width) less than width W1, and having length L1. In some case these fins have a length less than L1. Top surface 503 may be at, and fins 507, 508 and 510 may have height H4 above surface 203. Height H4 may be equal to or less than height H2. For example, surfaces 503 may be at or below the height of surfaces 403. Fins 507, 508 and 510 are shown having height H5 above surface 413 of trench oxide material 417, and above surface 523 of material 102 of substrate 101. The etch to form fins 507, 508 and 510, may etch a height of fins 407, 408 and 410 equal to height H5, such that surface 523 is planar with or level with surface 413. In some cases, surface 523 is above or below surface 413. The etch to form fins 507, 508 and 510, may be described as a "second" etch (e.g., to form the narrower fins), such as where the etch at FIG. 2 or 4 (or block 820 or 845) is considered a "first" etch to form the narrower fins (e.g., prior to the second etch).

The etch to form fins 507, 508 and 510 maybe a trim etch of from 1 to 15 nm of each sidewall and the top surface of the fins (e.g., TH1). This etch may depend on the original W1, such as by removing more for greater W1. In some cases, as the width is trimmed, the height will also be reduced by an equal or larger amount. According to embodiments, this reduction in fin height may be undesirable, so in some cases, it is advantageous for the etch to form fins 507, 508 and 510 to be in a range of between 1-5 nm for fin width trimming.

The etch to form fins 507, 508 and 510 maybe a selective etch, to selectively etch material 102, but not material 417. This etching may include simultaneously etching surfaces 403 and sidewalls 113 and 115. In some cases this etch is an anisotropic etch. According to embodiments the etch to form narrower fins 507, 508 and 510 removes a thickness TH1 of between 1 nm and 15 nm of top surfaces 403 and of sidewall surfaces 113 and 115 of fins 407, 408 and 410. In some cases the etch removes thickness TH1 of between 5 and 15 nm of those surfaces and sidewalls. In some cases the etch removes thickness TH1 of between 1 and 5 nm of those surfaces and sidewalls. In some cases the etch removes thickness TH1 of 8, 10, or 15 nanometers of those surfaces and sidewalls. In some cases, etching the top surfaces and the sidewalls of the electronic device fins includes forming the etched fins by trimming a width of the device fins from greater than 10 nm to 30 nm to a width of the etched fins of less than 7 nm to 15 nm.

This etch may form surfaces 503 and sidewalls 513 and 515, which do not contain damaged regions due to excessive high energy bombardment, oxidation, or etch residues; such as compared to the etch to form fins 107, 108 and 110; or compared to a dry etch that employs high energy ion bombardment etch (e.g. as known in the art as a physical etch). This etch may exclude or not include a dry etch, a high energy ion bombardment etch; or allowing oxidation of exposure to oxygen, or residue to form on surfaces 503 and sidewalls 513 and 515. Thus this etch may reduce or remove defects or damage in a single crystal material subsequently, epitaxially grown on surface 503 and sidewalls 513 and 515. If such defects were to exist and propagate throughout the channel material, they can lead to yield and drive current reduction issues in a device built on a device layer formed from epitaxial growth on the fin. In some cases, the bits that exude above the STI plane (e.g., portion 582 extending above surface 413 or 523) are the narrower fin. In some cases, the part below the STI plane (e.g., portion 584) does not conduct a usable or relevant amount of carriers and is defined as a subfin, which has no electronic relevance to the function of the channel.

Such etching may used a "timed" etch, such as an etch for a period of time known to remove thickness TH1 of material 102 from surfaces 406 and sidewalls 113 and 115. The fins may be or include an "exposed" device well or channel region extending or disposed above surface 413 or 523. Fins 507, 508 and 510 may be described as "narrow" or "narrower" fins, such as fins that result after "wide" or "wider"

fins are further etched as noted herein, such as at least with respect to FIG. 5 and block 850.

According to embodiments, etching the top surfaces and the sidewalls of the wider electronic device tins includes using one of (1) chlorine or fluorine based chemistry using low ion energy plasma processing, or (2) thermal processing. In some cases, using chlorine based chemistry. According to embodiments, etching the top surfaces and the sidewalls of the wider electronic device fins may include using low ion energy plasma processing such as using low energy chlorine containing plasma. In some cases, using chlorine or fluorine based chemistry may include using less than 1 kW of radio frequency energy, such as for between 10 and 40 seconds. In some cases, using thermal processing in presence of HCl may include etching in an epitaxial deposition reactor. In some cases, using thermal processing may include using less than 900 degrees Celsius heat in a wafer processing chamber, such as for between 30 and 120 seconds. Another example is anneal in presence of Cl2 at a temperature below 700 degrees Celsius for 60 sec.

In some cases, FIG. 5 may show substrate 101 after forming trimmed fins 507, 508 and 510 fins by introducing substrate 101 having single crystal silicon fins 407, 408 and 410 into an epitaxial deposition tool or in epitaxial reactor to etch those fins down to form single crystal silicon fins 507, 508 and 510. The tool may use Cl based chemistry using low ion energy plasma processing or thermal processing to trim the fin width (e.g., width W1 of fins 407, 408 and 410) from greater than 10 nm (e.g., 30, 20 or 15 nm) to a width (e.g., width W3 of fins 507, 508 and 510) of 15 nm or below (e.g., 15, 10, 7 nm). In some cases, the low ion energy plasma processing may use an epitaxial deposition tool and a Cl based chemistry using low ion energy plasma processing to achieve a trim etch. One example of this etch includes: using low energy Cl containing plasma, using 200 mT, using 10 sccm Cl2, using 100 sccm H2, using 300 sccm Ar, using 500 W of radio frequency energy, using ion energy 2 eV, and etching for 20 seconds, for example. In some cases, the thermal processing may use an epitaxial reactor using low heat processing to achieve a trim etch. One example of this etch includes: using in epi reactor: using 750 celsius (C), using 100 sccm HCl, using 10000 sccm H2, using 20 T and etching for 60 seconds, for example.

Such fins 507, 508 and 510 may be used to form fin devices including fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type (e.g., doped to have electron charge carriers) MOS device (n-MOS) channels and movement of positive charged holes in P-type (e.g., doped to have hole charge carriers) MOS device (p-MOS) channels.

According to embodiments, top surfaces and sidewalls of fins 507, 508 and 510 have or maintain the same atomic lattice and crystal structure as that of fins 407, 408 and 410, but contain fewer surface crystal defects, less ion damage, less oxidation and less etch residues than that of fins 407, 408 and 410. As a result, there may be fewer defects in or unwanted atoms or material in the crystalline structure of subsequently clad or deposited layers, grown from top surfaces and sidewalls of fins 507, 508 and 510 (e.g., as compared to that of fins 407, 408 and 410). Consequently, the crystalline structure of the subsequently clad or deposited layer growth from fins 407, 408 and 410 would include defects due to the defects in or additional material upon the crystaline structure of the silicon fin top and sidewall surfaces that will not exist in growth from fins 507, 508 and 510. Thus, avoiding or reducing such ion damage, oxidized surfaces and etch residues increases transistor performance.

In some cases, etching using of less energy, lower ion bombardment energy avoids damage to the crystalline structure of the top surface and side walls of the fins while removing atoms during the etch. This type of etching may provide or create narrower fins with clean top and sidewall surfaces of reduced defect crystal lattice (e.g., without defects due to etching to form fin 507 from fin 407). This etching may maintain a pure crystal lattice existing below the top and sidwall surfaces of fin 407; may avoid creating amorphized material and avoid vacancy or interstitial atoms on top and sidwall surfaces of fin 507, such as by excluding or avoiding what is considered a "physical etch" i.e. ion damage. For example chlorine ions in the plasma may have an impingement energy equal to or less than 2 eV which chemically, rather than physically etches the silicon fin and avoids damage the crystal lattice.

A thermal treatment may be or include an all chemical, no plasma etch that uses HCl or C12 for example at a high enough temperature that converts the silicon atoms on the surface when the chlorine interacts with those silicon atoms to form SiCl4 gas which is then pumped out of the chamber during treatment, but does not use a high enough temperature to damage or amorphize the crystal lattice of exposed surfaces of the etched fin 507. The thermal etch may be or include a dynamic treatment with no plasma, and be at less than 900 degrees Celsius. In some cases, in this recipe no physical sputtering occurs but the chlorine reacts to form SiCl4 gas which evaporates away from the Si surfaces and is pumped out.

According to some embodiments, fins 507, 508 and 510 are electronic device fins having narrower upper fin portion 582 formed on and from wide lower fin portion 584. The upper and lower portions may be formed from substrate 101 of a first single crystal material 102. The upper and lower portions may be formed under first top surface area 111. The wide lower fin portion 584 may have wide single crystal top surfaces and wide sidewalls with width W1 between first thickness H3 of trench oxide material 417 in trenches formed between the first top surface areas. The narrower upper fin portion 582 may have narrower single crystal top surfaces and narrower sidewalls with width W3 and with a same single crystal lattice as the wide single crystal top surfaces and the wide sidewalls. The wide single crystal top surfaces and the wide sidewalls with width W1 may have a thickness of between a 5 nm and 15 nm greater than a thickness of the narrower single crystal top surfaces and the narrower sidewalls with width W1. The narrower upper fin portion 582 may be exposed above the first thickness H3 of trench oxide material 417 in the trenches. In some cases, portion 584 may be described as sub-channel. In some cases, portion 582 is the channel and hence may conduct most of the carriers while portion 584 will be far from the gate electrode and will not be part of the channel.

According to some embodiments, FIG. 5 provides embodiments where the fins are trimmed and no additional cladding layer is added. In some cases, these narrower fins can be used to create transistors that will be improved by virtue of the better electrostatics of the narrow fin versus an equivalent device with a wide fin.

Figure 6:
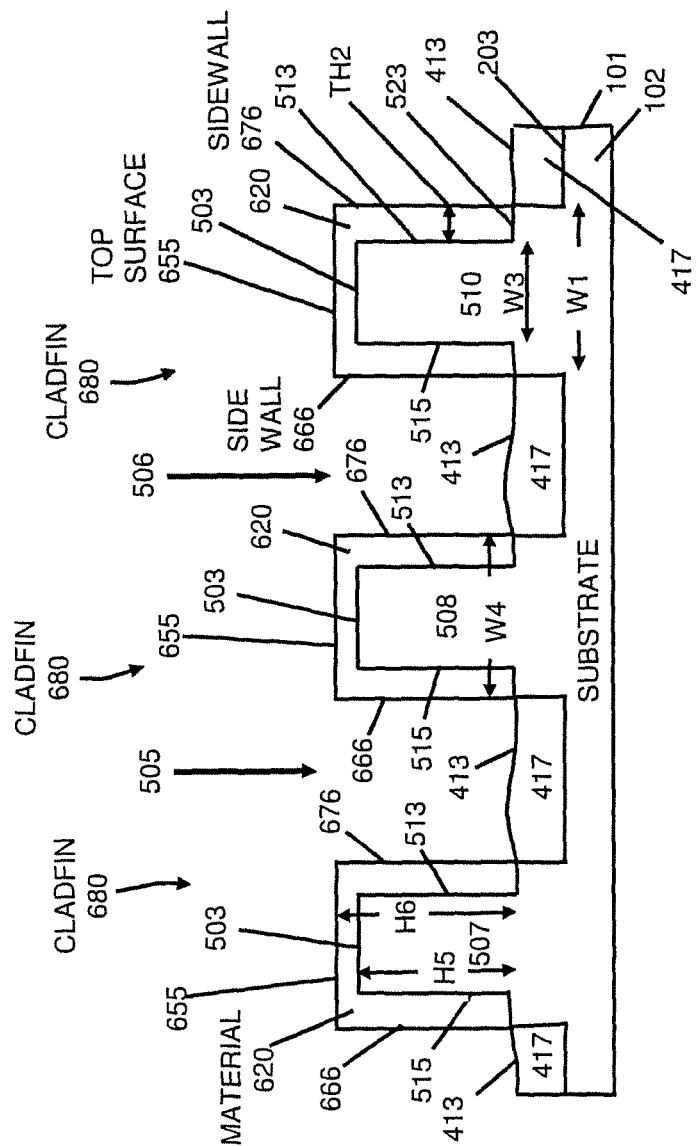
FIG. 6 shows the semiconductor substrate of FIG. 1 after depositing a second single crystal material on the etched top and sidewall surfaces of the narrower etched fins.

FIG. 6 shows the semiconductor substrate of FIG. 1 after depositing a second single crystal material on the etched top and sidewall surfaces of the narrower etched fins. In some cases, immediately and without air break, after etching to form fins 507, 508 and 510, SiGe or Ge deposition of material 620 is performed on substrate 101 (e.g., on fins 507, 508 and 510), such as is shown in FIG. 6. In some cases, FIG. 6 shows epitaxial layer 620 deposited on trimmed fins 507, 508 and 510. Layer 620 may be a second crystal structure grown from the single crystal crystal structure of material 102 at top surface 503 and from sidewalls 513 and 515.

FIG. 6 shows substrate 101 after depositing or growing single crystal material or layer 620 on fins 507, 508 and 510. Material 620 may be epitaxially grown from or on surfaces 503 and sidewalls 513 and 515. Material 620 may be thickness TH2 at surface 503 and sidewalls 513 and 515. Material 620 may be epitaxially grown as a "blanket" layer on surface 503 and sidewalls 513 and 515. Material 620 may have top surface 655 and sidewalls 666 and 676. Surface 655 may be of height H6 of the surface 413. Material 620 may be a single crystal material that is the same as or different than the single crystal material 202 of substrate 101. In some cases material 202 is single crystal silicon, and material 620 is single crystal germanium. In some cases material 202 is single crystal silicon and material 620 is single crystal silicon germanium having a percentage of germanium of between 30 and 70 percent. In some cases the percentage of germanium is between 0 and 100%. In some case the percentage of germanium is 10%, 30%, 50%, or 70%.

Material 620 on fins 507, 508 an 510 may form clad fins 680, having width W4, height H6 above surface 413, and length L1 into the page (not shown). Fins 680 may be described as etched silicon fins having side-cladding layers (e.g. material 620) of silicon germanium.

In some cases width W4 is less than width W1, but greater than width W3. In some cases width W4 is greater than width W1. In some cases Width W4 is less than or equal to 20 nm wide. In some cases width W4 is 15 nm, 18 nm, 20 nm, 22 nm, or 24 nm.

Material 620 may be formed on, grown from, and touching material 102 (e.g., surfaces 503 and sidewalls 513 and 515). Material 620 may be formed to a conformal thickness (e.g., a thickness increasing the "height" on the top surface and "width" on the sidewalls) over fins 507, 508 and 510. The conformal thickness TH2 may be between 1 and 5 nanometers (nm). In some cases the conformal thickness TH2 is between 1 and 10 nanometers (nm). In some cases the conformal thickness TH2 is approximately 2 nm. In some cases the conformal thickness TH2 is approximately 5 nm. According to some embodiments, forming material 620 includes epitaxially cladding or growing material 620 along, across, touching or against the sidewall surfaces and the top surface of the electronic device fin 507.

Material 620 may be formed by epitaxial growth (e.g., heteroepitaxy growth) using atomic layer epitaxy (ALE), chemical vapor deposition (CVD), Metal-Organic Chemical Vapour Deposition (MOCVD) or Metal-Organic vapour phase epitaxy (MOVPE), and may only grow from "seed" top surface 503 and sidewalls 113 and 115 of material 102, but not grow from oxide 417. In some cases, material 620 may be formed by epitaxial growth (e.g., heteroepitaxy). In some cases, material 620 may be formed by selective growth, such as by a CVD type of growth, gas source-molecular beam epitaxy (GS-MBE), rapid thermal (RT) CVD, or ultra high vacuum (UHV)-CVD. Choice of growth conditions such as growth temperature, pressure of gas flux, etc may define the selectivity of the epitaxial growth. In some cases, the growth of material 620 is grown selectively from material 102 by choosing or using a predetermined growth temperature range, pressure, gas flux range, etc., as known for material 620 to grow from material 102, but not grow from or initiate on material of the oxide surfaces.

In some cases, material 620 may be a "device" layer, such as a layer on or in which circuitry devices are formed, as known in the art. Thus, the fins formed from material 620 may provide electronic device channel material on or in which defect free fin based devices may be formed.

Material 620 may have a bottom surface having a (100) crystal oriented material grown from surface 103, and side surfaces having a (110) crystal oriented material along or adjacent to sidewalls 113 and 115. Material 620 may have a bottom surface along surface 503 and sidewalls 513 and 515 having the same crystal orientation as those surfaces. In some cases, surface 655 and sidewalls 666 and 676 having a same crystal orientation as surface 503 and sidewalls 513 and 515, such as due to being material grown from those surfaces.

In some cases, material 620 may be a "cladding" material that is "selectively" grown only from a desired single crystal material (e.g., surfaces 503 and sidewalls 513 and 515) but not from other polycrystal, dielectric, oxide, nitride or amorphous exposed materials (e.g., that are not the desired or are not a single crystal material). In some cases, a "cladding" material (e.g., material 620) may be "selectively" grown only from a desired single crystal material (e.g., surfaces 503 and sidewalls 513 and 515) by masking or forming oxide layers over materials that it is not desired to have the "cladding" material form or grow from.

In some cases, material 620 is a selectively grown epitaxial layer. In some cases, material 102 is single crystal Si material; and material 620 is a layer of single crystal SiGe material (e.g., 70 percent Si, and 30 percent Ge) such as for an P-type device formed from fin 245. In some cases, material 620 is a layer of single crystal SiGe material (e.g., 30 percent Si, and 70 percent Ge) such as for an P-type device formed from fin 245.

In some cases, material 620 is a channel material or layer for a tri-gate device having the channel conducting charges mostly along or through material 620. This may include conducting charges mostly along or through top surface 655 and sidewalls 666 and 676.

Fins 680 (e.g., clad with material 620) may be used to form fin devices including fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type (e.g., doped to have electron charge carriers) MOS device (n-MOS) channels and movement of positive charged holes in P-type (e.g., doped to have hole charge carriers) MOS device (p-MOS) channels.

According to some embodiments, fins 680 further increase in the mobility of the holes (e.g., carriers) in the p-channel (e.g., channel of PMOS device formed by fin 680) by providing a compressive strain to the channel body because the lattice spacing of the Si material 102 (e.g., at surfaces 503 and sidewalls 513 and 515) is smaller than that of the SiGe or Ge material 620 grown from or touching those surfaces. This causes a compressive strain in material 620 where a majority of the carriers flow through the channel. In some cases, material 620 has at least 10% germanium; at least 30% germanium; between 30% and 50% germanium; between 30% and 100% germanium; or between 50% and 100% germanium. In some cases, most carriers in the channel are at the outer surfaces or outer edges of the cladding 620. In some cases, most carriers in the channel are at the inner surfaces or inner edges of the cladding 620.

A benefit of having fins with silicon having a width of W3 or material 620 having a width of W4 includes that such reduced width fins make it easier to electronically invert the channel by application of gate bias and reduce carrier leakage when the gate is not biased. This is as opposed to wider fins (e.g., fins 107) which may have worse electronic properties than the narrower fins.

In some embodiments, equipment for forming fins 107, 407, 507 and 680 may include equipment from suppliers that are configured into a system including various chambers and vessels that have a vacuum sealed environment, and a robot for moving wafers between the various chambers. The "in-situ" methods herein may include keeping or maintaining substrate 101 and fins within these vessels or within this vacuum environment (e.g., system) so that the substrate and fins are not exposed to air although they may be moved into different chambers of the system, such as by being moved to chambers of the same equipment set without breaking the vacuum seal of the chambers, or without an "air break" during movement of the substrate between chambers.

Figure 7:
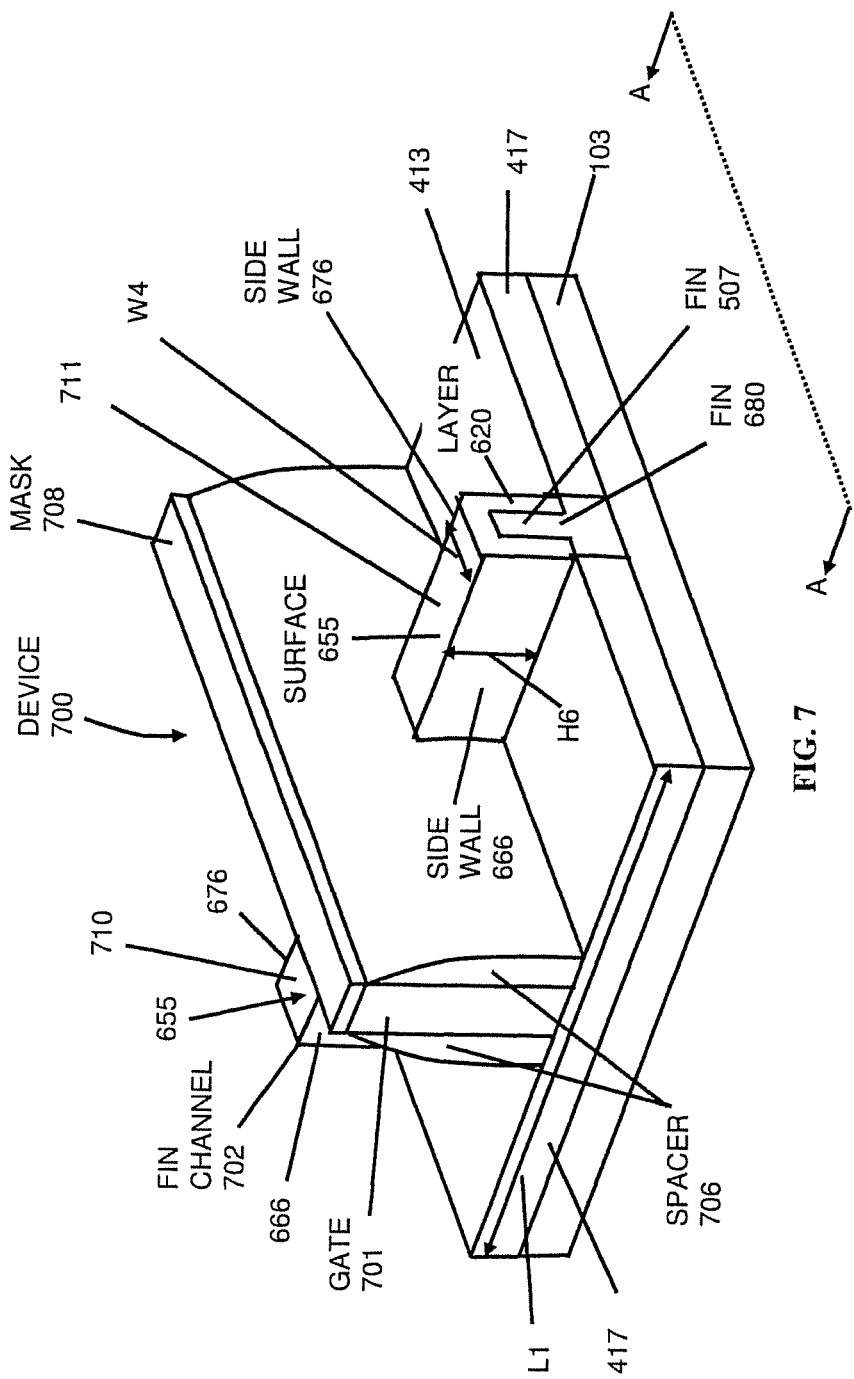
FIG. 7 is a schematic perspective view of the semiconductor substrate of FIG. 1 after forming a gate electronic device on the second single crystal material formed on the etched top and sidewall surfaces of one of the narrower etched fins.

FIG. 7 is a schematic perspective view of the semiconductor substrate of FIG. 1 after forming a gate electronic device on the second single crystal material formed on the etched top and sidewall surfaces of one of the narrower etched fins. FIG. 7 shows cross sectional view perspective A-A, which may be the perspective of FIGS. 1-6. FIG. 7 may schematically illustrate a perspective view of transistor device 700, in accordance with some embodiments.

FIG. 7 shows substrate 101 after forming gate electronics device 700 on material 620 formed on surfaces 503 and sidewalls 513 and 515 of narrower etched fins 507, 508 and 510. Device 700 may have a narrow channel 702 that is or includes fin 680. Fin 680 has length L1, width W4 and height H6 above surface 413 or 523. narrow channel 702 may have top surface 655 and sidewalls 666 and 676. A gate dielectric (not shown) may be formed over surface 655 and sidewalls 666 and 676 under gate electrode 704, spacers 706 may be formed on or beside gate electrode 704. Mass 708 may be formed on the top surface of gate electrode 704. Mask 708 may be a hard mask that can be removed to form a metal gate contact. Device 700 includes fin 680 and may be formed on material 417. In some cases, device 700 is a PMOS device formed from the clad electronic device fin 680, wherein the PMOS device include gate 701 on second single crystal material 620; and junction regions (not shown) on both sides and adjacent to the gate and in the second single crystal material.

According to some embodiments, FIG. 7 schematically illustrates a perspective view of a transistor device 700, in accordance with some embodiments. In some embodiments, the transistor device 700 includes a semiconductor substrate 101, a fin structure 680 including a portion composed of SiGe alloy (hereinafter "SiGe material 620") and a portion composed of Si (hereinafter "Si fin 507"), electrically insulative material 417, a gate 701 including a gate dielectric (not shown, but between electrode 704 and surface 655 and sidewalls 666 and 676) and gate electrode 704, coupled as can be seen.

The transistor device 700 may represent a transistor or part of a transistor in various embodiments. For example, the fin structure 680 may extend along a surface of the semiconductor substrate 101 (e.g., through material of gate 701). A source and drain (not shown) may be formed on or in portions 710 and 711 of the fin structure 680 that are separated by the gate 701 to provide a source and drain for mobile charge carriers (e.g., holes or electrons) that may flow through a channel body formed from the fin structure 680. The gate 701 may, for example, be configured to control the flow of the mobile charge carriers through the channel body by application of a threshold voltage to the gate electrode 704. The channel body may include part of a fin structure 680 formed from Si of the semiconductor substrate 101. In some embodiments, the channel body may include portions of the SiGe material 620 of the fin structure 680 and may be disposed in a gate region between the source and the drain.

The semiconductor substrate 101 may be composed of Si in some embodiments. For example, the semiconductor substrate 101 may include n-type or p-type (100) off-oriented Si, the crystalline directions of the semiconductor substrate 101 being symbolized by the convention (xyz), where x, y, and z represent respective crystallographic planes in three dimensions that are perpendicular to one another. The semiconductor substrate 101 may, for example, include material of a (100) direction off-cut in a range between about 2 degrees to about 8 degrees towards a (110) direction. Other off-cut orientations or a semiconductor substrate 101 without an off-cut orientation may be used. The semiconductor substrate 101 may have a high resistivity between about 1 Ω-cm to about 50 kΩ-cm. The semiconductor substrate 101 may include other materials in other embodiments. In some embodiments, the semiconductor substrate 101 is part of a singulated die of a wafer. In one embodiment, the semiconductor substrate is a p-type substrate.

According to various embodiments, the SiGe material 620 of the fin structure 680 may be formed by etching fin 407 (or 107) to form narrower fin 507 and depositing a transistor element such as, for example, the material 620 using techniques described herein. In some embodiments, only a portion of the fin structure 680 is covered with material 620. The Si fin 507 of the fin structure 680 may be composed of a defect-free single crystal in some embodiments. In other embodiments, most or all of the transistor element (e.g., fin structure 680) may be covered with material 620.

The transistor device 700 may be p-type or n-type. The channel body formed using the SiGe material 620 may provide greater mobility of mobile charge carriers for p-type. For example, increasing a concentration of germanium (Ge) in the channel body may increase mobility of electrons or holes by nature of the material. A second mechanism causes further increase in the mobility of the holes in the p-channel (e.g., channel of PMOS device) by providing a compressive strain to the channel body because the lattice spacing of the Si material 102 is smaller than that of the SiGe or Ge material 620, thus causing a compressive strain in material 620 where a majority of the carriers flow through the channel.

The compressive strain of the SiGe material 620 will reduce mobility of electrons for n-channel (e.g., channel of NMOS device). Thus, increasing the concentration of Ge in the n-channel may result in little to no mobility improvement for electrons. In one embodiment, the transistor device 700 is p-type (e.g., PMOS device). The PMOS device may have a p-channel that is doped n-type and the NMOS device may have an n-channel that is doped p-type.

The electrically insulative material 417 may be deposited on the semiconductor substrate 101 and may abut the fin structure 680, as can be seen. The electrically insulative material 417 may include any suitable material for shallow trench isolation (STI). In some embodiments, the electrically insulative material 417 may include dielectric materials known for their applicability in integrated circuit structures, such as low-k dielectric materials. Examples of dielectric materials that may be used include, but are not limited to, silicon oxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

The gate dielectric (not shown, but between electrode 704 and surface 655 and sidewalls 666 and 676) may be formed on the channel body and may be composed of a material such as silicon dioxide ($SiO_2$) or a high-k material. Examples of high-k materials that may be used to form the gate dielectric (not shown, but between electrode 704 and surface 655 and sidewalls 666 and 676) include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric (not shown, but between electrode 704 and surface 655 and sidewalls 666 and 676) to improve its quality when a high-k material is used. In some embodiments, the gate dielectric (not shown, but between electrode 704 and surface 655 and sidewalls 666 and 676) may include a dummy oxide that is subsequently removed in a process flow together with a dummy gate electrode and replaced with a high-k gate dielectric and metal gate, according to well-known techniques.

The gate electrode 704 may be formed on the gate dielectric (not shown, but between electrode 704 and surface 655 and sidewalls 666 and 676) and may be composed of at least one p-type workfunction metal or n-type workfunction metal, depending on whether the transistor is to be a PMOS (e.g., p-type) or an NMOS (e.g., n-type) transistor. In some embodiments, the gate electrode 704 may consist of two or more metal layers, where at least one metal layer is a workfunction metal layer and at least one metal layer is a fill metal layer. In some embodiments, the gate electrode 704 is a polysilicon gate electrode. In other embodiments, the gate electrode 704 is a dummy polysilicon gate electrode that is subsequently removed in a process flow and replaced with a metal gate electrode, according to well-known techniques.

For a PMOS transistor, metals that may be used for the gate electrode include, but are not limited to, ruthenium, palladium, platinum, cobalt, nickel, and conductive metal oxides, e.g., ruthenium oxide. A p-type metal layer may enable the formation of a PMOS gate electrode with a workfunction that is between about 4.9 eV and about 5.2 eV. For an NMOS transistor, metals that may be used for the gate electrode 704 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer may enable the formation of an NMOS gate electrode with a workfunction that is between about 3.9 eV and about 4.2 eV.

In some embodiments, a pair of spacers 706 may bracket the gate 701. For example, the spacers may be disposed on opposing surfaces of the gate electrode 704. The spacers may be formed from a material such as silicon nitride, silicon oxide, silicon carbide, silicon nitride doped with carbon, and silicon oxynitride. Processes for forming spacers may generally include deposition and etching processes and/or other well-known techniques.

The transistor device 700 of FIG. 7 depicts a tri-gate configuration. In other embodiments, similar principles and techniques as described herein for converting a transistor element from Si to SiGe may be used for other transistor configurations including, for example, planar, dual-gate, all around gate (AAG) (also referred to as gate all around), wire (e.g., nanowire), and other suitable transistor configurations.

Figure 8:
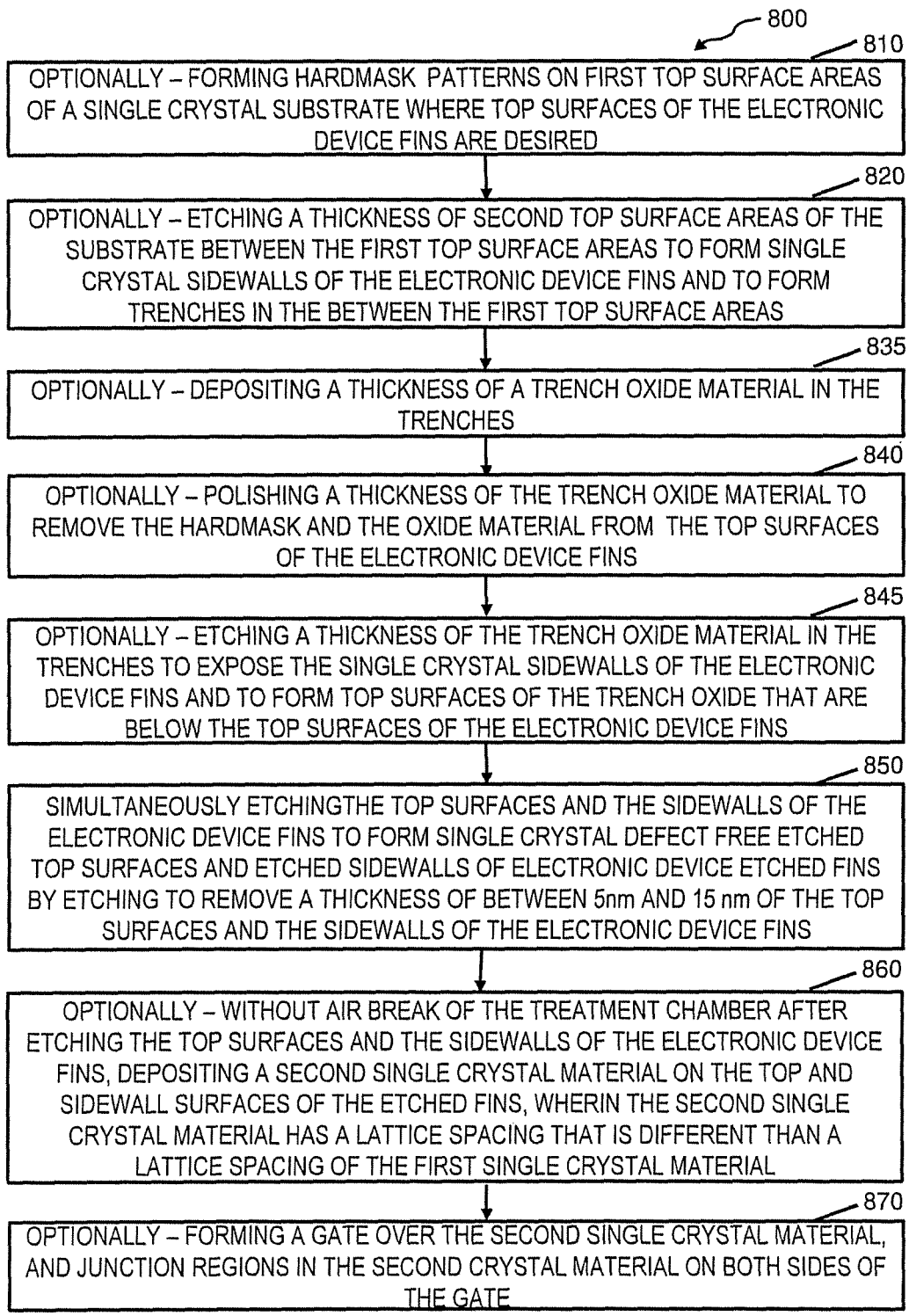
FIG. 8 is an example process for forming a gate electronic device on a second single crystal material formed on narrower etched single crystal top and sidewall surfaces of a narrower etched electronic device fin.

FIG. 8 is an example process for forming a gate electronic device on a second single crystal material formed on narrower etched single crystal top and sidewall surfaces of a narrower etched electronic device fin. FIG. 8 may show process 800 for forming fins 507, 508 and 510. In some cases process 800 is a process performing clad fins 680. In some cases, the process is 800 is or includes part of a process for forming device 700.

FIG. 8 shows process 800 beginning with block 810 where, in some optional cases, hardmask patterns are formed on first top surface areas of a single crystal substrate where top surfaces of the electronic device fins are desired. This may include forming masks 160 an areas 111 as described herein. Block 810 may include descriptions herein for FIG. 1.

At block 820, in some optional cases, a thickness of second top surface areas of the substrate between the first top surface areas is etched to form single crystal sidewalls of the electronic device fins and to form trenches in the between the first top surface areas. This may include forming trenches 105 and 106; and sidewalls 113 and 115 as described herein. Block 820 may include descriptions herein for FIG. 2. The etch at block 820, may be described as a "first" etch (e.g., to form the thicker fins), such as where the etch at FIG. 5 (or block 850) is considered a "second" etch to form the narrower fins (e.g., after the first etch).

At block 835, in some optional cases, a thickness of a trench oxide material is deposited in the trenches and over the masks. This may include depositing material 307 as described herein. Block 835 may include descriptions herein for FIG. 3.

At block 840, in some optional cases, a thickness of the trench oxide material and the hardmasks are polished down to form the top surfaces of the electronic device fins. This may include removing a thickness of material 370 and hardmasks 160 to expose surfaces 403 as described herein. This may include removing all of hardmasks 160 (e.g., of block 810) as described herein. Block 840 may include descriptions herein for FIG. 4.

At block 845, in some optional cases, a thickness of the trench oxide material in the trenches is etched to expose the single crystal sidewalls of the electronic device fins and to form top surfaces of the trench oxide that are below the top surfaces of the electronic device fins. This may include etching a thickness of material 307 in trenches 105 and 106 down to surfaces 413 to form trench oxide 417; to expose the single crystal sidewalls 113 and 115 of the electronic device fins; and to form top surfaces 413 of the trench oxide that are below the top surfaces 403 of the electronic device fins as described herein. Block 845 may include descriptions herein for FIG. 3. The etch at block 845 may be described as a "first" etch (e.g., to form the thicker fins), such as where the etch at FIG. 5 (or block 850) is considered a "second" etch to form the narrower fins (e.g., after the first etch).

At block 850, the top surfaces and the sidewalls of the electronic device fins are (e.g., simultaneously) etched to form single crystal defect free etched top surfaces and etched sidewalls of electronic device etched fins. This may include etching to remove a thickness of between a 5 nm and 15 nm of the top surfaces and the sidewalls of the electronic device fins. This may include simultaneously etching top surfaces 403 and the sidewalls 113 and 115 of electronic device fins 407 and 408 (e.g., simultaneously) to form single crystal defect free etched top surfaces 503 and the sidewalls 513 and 515 of narrower electronic device fins 507 and 508 as described herein. Block 850 may include descriptions herein for FIG. 5. Block 850 may include etching the top surfaces and the sidewalls of the electronic device fins to form narrower etched single crystal top surfaces and sidewalls of a narrower etched electronic device fins. In some cases, block 850 includes maintaining (e.g., not creating defects in) the single crystal structure of the top and sidewall surfaces of the device fins of the etched top surfaces 503 and the sidewalls 513 and 515. The etch to form fins 507 and 508, may be described as a "second" etch (e.g., to form the narrower fins), such as where the etch at FIG. 2 or 4 (or block 820 or 845) is considered a "first" etch to form the narrower fins (e.g., prior to the second etch).

In some cases, block 850 includes etching the top surfaces and the sidewalls of the electronic device fins using one of (1) chlorine based chemistry using low ion energy plasma processing, or (2) thermal processing. In some cases, etching the top surfaces and the sidewalls of the electronic device fins includes forming the etched fins by trimming a width of the device fins from greater than 10 nm to 30 nm to a width of the etched fins of less than 7 nm to 15 nm.

At block 860, in some optional cases, a second single crystal material is deposited on or grown from the top and sidewall surfaces of the etched narrow fins (e.g., of block 850). This may include the second single crystal material being deposited on or grown, without air break of the treatment chamber after etching the top surfaces and the sidewalls of the electronic device fins in block 850. The second single crystal material may have a lattice spacing that is different (e.g., larger) than a lattice spacing of the first single crystal material. This may include, without air break of the treatment chamber after etching to form narrower fins 507 and 508, depositing second single crystal material 620 on the top surfaces 503 and sidewalls 513 and 515 of the etched narrower fins, wherein the second single crystal material has a lattice spacing that is different than a lattice spacing of the first single crystal material as described herein. Block 860 may include descriptions herein for FIG. 6.

At block 870, in some optional cases, a gate is formed over the second single crystal material, and junction regions are formed in the second single crystal material adjacent to and on either side of the gate. This may include forming gate 701 over the second single crystal material 620, and forming junction regions in the second single crystal material 620 as described herein. This may include forming a cladding of SiGe material 620 of the fin structure 680 may be formed by etching fin 407 (or 107) to form narrower Si fin 507 and depositing a transistor element such as, for example, the material 620 as described herein. This may include forming part of or all of device 700 as described herein. Block 870 may include descriptions herein for FIG. 7.

Thus, the processes described herein may avoid avoid or reduce high energy ion bombardment, oxidation and etch residues on Silicon fin surfaces, which are damaging to the quality of subsequently clad or deposited layers. Consequently, the crystaline structure of subsequently clad or deposited layer growth will not include defects due to the defects in or additional material upon the crystaline structure of the silicon fin top and sidewall surfaces. That growth may provide electronic device material (e.g., wells and/or channels) in which defect free fin based devices and transistors may be formed. Thus, avoiding or reducing such bombardment, oxidation and residues increases transistor performance.

Such transistors may include finfets, Ge cladding, SiGe channels, SiGe cladding, trigate transistors. Such transistors may be produced by High Volume Architecture and may be embodied in computer system architecture features and interfaces made in high volumes. Such transistors may be included in or formed by very large scale integration (VLSI) logic processes.

Figure 9:
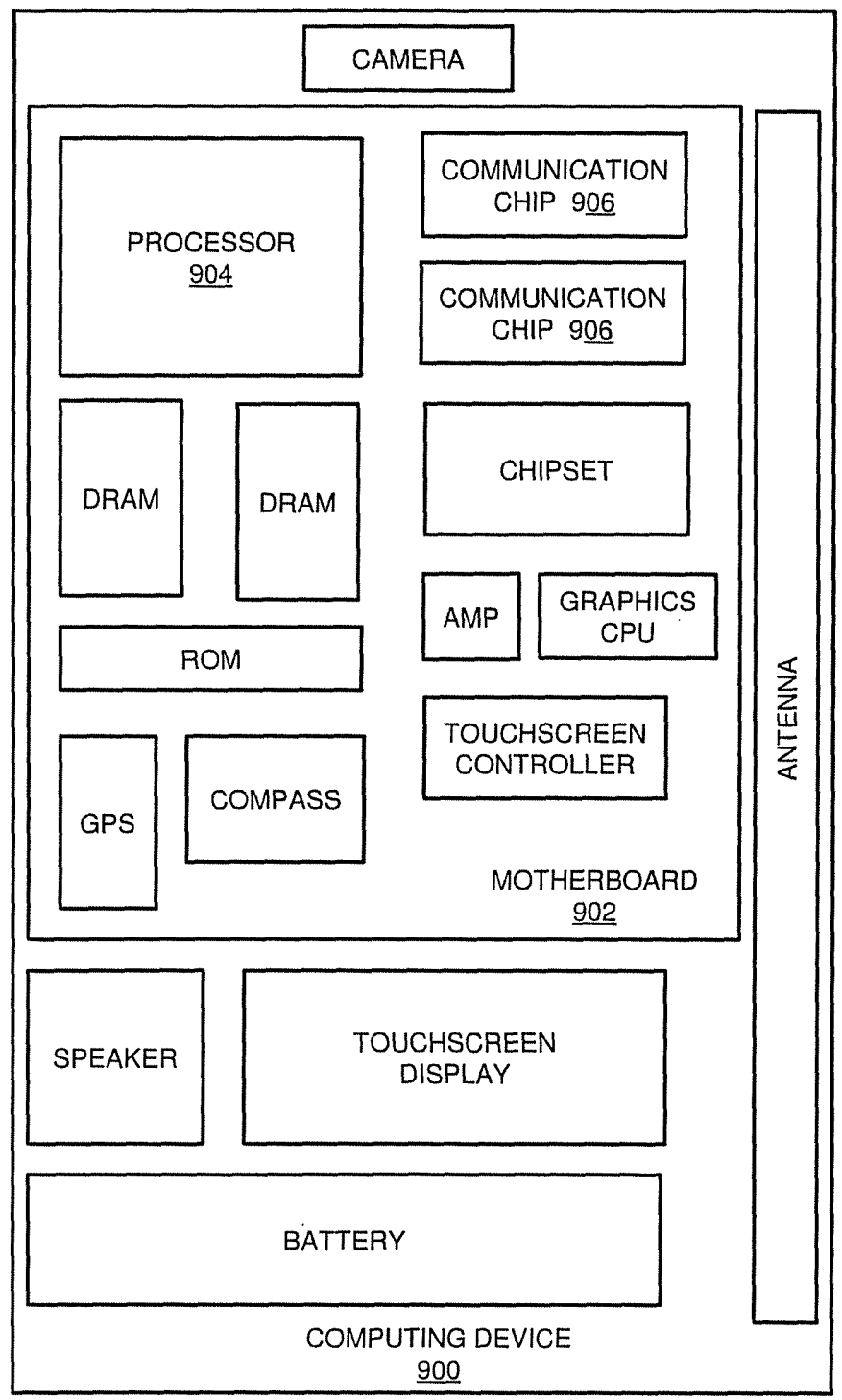
FIG. 9 illustrates a computing device in accordance with one implementation.

FIG. 9 illustrates a computing device 900 in accordance with one implementation. The computing device 900 houses board 902. Board 902 may include a number of components, including but not limited to processor 904 and at least one communication chip 906. Processor 904 is physically and electrically connected to board 902. In some implementations at least one communication chip 906 is also physically and electrically connected to board 902. In further implementations, communication chip 906 is part of processor 904.

Depending on its applications, computing device 900 may include other components that may or may not be physically and electrically connected to board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die packaged within processor 904. In some implementations, the integrated circuit die includes transistors formed by epitaxially growing second crystal material 620 on surfaces of etched, thinned first crystal material fins (e.g., 507, 508 and 510) formed by etching wider fins of the first crystal material, such as described with reference to FIGS. 1-8. In some implementations, the integrated circuit die includes electronic device fins having narrower upper fin portion 582 formed on and from wide lower fin portion 584, such as described with reference to FIGS. 1-8. The term "processor" may refer to any device or portion of a device that processes electronic data from registers and/or memory to transform that electronic data into other electronic data that may be stored in registers and/or memory.

Communication chip 906 also includes an integrated circuit die packaged within communication chip 906. In accordance with another implementation, a package including a communication chip incorporates one or more fin devices having transistors formed by epitaxially growing a second crystal material on surfaces of etched, thinned first crystal material fins formed by etching wider fins of the first crystal material such as described above. In further implementations, another component housed within computing device 900 may contain a microelectronic package including a fin device having cladding device layers such as described above.

In various implementations, computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 900 may be any other electronic device that processes data.

EXAMPLES

The following examples pertain to embodiments.

Example 1 is a method to form electronic device fins comprising: etching away a thickness of a substrate between first top surface areas of a substrate of a first single crystal material to form wide electronic device fins under the first top surface areas and to form trenches between the first top surface areas, the wide electronic device fins having wide single crystal top surfaces and wide sidewalls; then forming a first thickness of a trench oxide material in the trenches and below the first top surface areas; and then etching a thickness of the wide single crystal top surfaces and the wide sidewalls of the wide electronic device fins to form narrower electronic device fins from the wide fins, the narrower electronic device fins having narrower single crystal top surfaces and narrower sidewalls with a same single crystal lattice as the wide single crystal top surfaces and the wide sidewalls, wherein etching the thickness of the wide single crystal top surfaces and the wide sidewalls includes removing a thickness of between a 1 nm and 15 nm of the wide single crystal top surfaces and the wide sidewalls.

In Example 2, the subject matter of Example 1 can optionally further be comprising: after etching the thickness of the wide single crystal top surfaces and the wide sidewalls, without an air break of the treatment chamber, depositing a second single crystal material on the thinned top surfaces and thinned sidewalls to form clad electronic device fins, wherein the second single crystal material has a lattice spacing that is different than a lattice spacing of the first single crystal material.

In Example 3, the subject matter of Example 1 can optionally further be comprising: prior to etching away the thickness of the substrate, forming hardmask patterns on the first top surface areas of the single crystal substrate where top surfaces of the electronic device fins are desired; then after etching away the thickness of the substrate, removing the hardmasks; then depositing a second thickness of a trench oxide material in the trenches formed by etching away the thickness of the substrate between the first top surface areas; then polishing to remove a third thickness of the trench oxide material above the first top surface areas; then prior to etching the thickness of the wide single crystal top surfaces and the wide sidewalls, etching away a fourth thickness of the trench oxide material in the trenches to expose the wide single crystal sidewalls of the wide electronic device fins and to form the first thickness of a trench oxide material.

In Example 4, the subject matter of Example 1 can optionally include wherein etching the wide top surfaces and the wide sidewalls comprises maintaining in the narrower single crystal top surfaces and narrower sidewalls, a single crystal lattice structure of the wide top surfaces and the wide sidewalls.

In Example 5, the subject matter of Example 1 can optionally include wherein etching the wide top surfaces and the wide sidewalls comprises one of (1) etching using chlorine based chemistry using low ion energy plasma processing, or (2) etching using thermal processing.

In Example 6, the subject matter of Example 1 can optionally include wherein etching the wide top surfaces and the wide sidewalls comprises etching using chlorine based chemistry and using less than 5 kW of radio frequency energy for between 10 and 40 seconds.

In Example 7, the subject matter of Example 1 can optionally include wherein etching the wide top surfaces and the wide sidewalls comprises etching using chlorine based chemistry and using less than 1 kW of radio frequency energy for between 10 and 40 seconds.

In Example 8, the subject matter of Example 1 can optionally include wherein etching the wide top surfaces and the wide sidewalls comprises etching using thermal processing and using less than 900 degrees Celsius heat in an epitaxial deposition chamber for between 30 and 120 seconds in presence of HCl.

In Example 9, the subject matter of Example 1 can optionally include wherein etching the wide top surfaces and the wide sidewalls comprises etching using thermal processing and using less than 700 degrees Celsius heat in an epitaxial deposition chamber for between 30 and 120 seconds in presence of $Cl_2$.

In Example 10, the subject matter of Example 1 can optionally include wherein etching the thickness of the wide single crystal top surfaces and the wide sidewalls includes one of: (1) removing a thickness of between a 8 nm and 10 nm of the wide single crystal top surfaces and the wide sidewalls, or (2) forming the etched fins by trimming a width of the wide fins from greater than 10 nm to 30 nm to a width of the narrower fins of less than 7 nm to 15 nm.

In Example 11, the subject matter of Example 1 can optionally be further comprising: after etching the thickness of the wide single crystal top surfaces and the wide sidewalls, without an air break of the treatment chamber, depositing a second single crystal material on the thinned top surfaces and thinned sidewalls to form clad electronic device fins, wherein the second single crystal material has a lattice spacing that is different than a lattice spacing of the first single crystal material.

In Example 12, the subject matter of Example 11 can optionally include wherein the first single crystal material is Silicon and the second single crystal material is SiGe, and wherein depositing the second single crystal material comprises depositing a thickness of between a 5 nm and 15 nm of the second single crystal material on the thinned top surface and the thinned sidewalls.

In Example 13, the subject matter of Example 11 can optionally include wherein a width of the clad electronic device fins is equal to or less than 20 nm wide.

In Example 14, the subject matter of Example 11 can optionally be further comprising forming a PMOS device from the clad electronic device fins, wherein forming the PMOS device comprises: forming a gate on the second single crystal material; and forming junction regions adjacent to the gate and in the second single crystal material.

Example 15 is an electronic device fin comprising: a narrower upper fin portion formed on and from a wide lower fin portion, the upper and lower portions formed from a substrate of a first single crystal material, the upper and lower portions formed under a first top surface area of the substrate; the wide lower fin portion having wide single crystal top surfaces and wide sidewalls between a first thickness of a trench oxide material in trenches formed between the first top surface areas; and the narrower upper fin portion having narrower single crystal top surfaces and narrower sidewalls with a same single crystal lattice as the wide single crystal top surfaces and the wide sidewalls, wherein the wide single crystal top surfaces and the wide sidewalls have a thickness of between a 1 nm and 15 nm greater than a thickness of the narrower single crystal top surfaces and the narrower sidewalls, the narrower upper fin portion exposed above the first thickness of a trench oxide material in the trenches.

In Example 16, the subject matter of Example 15 can optionally include wherein narrower top surfaces and the narrower sidewalls maintain the single crystal lattice structure of the wide single crystal top surfaces and wide sidewalls.

In Example 17, the subject matter of Example 15 can optionally include wherein a thickness of the wide single crystal top surfaces and the wide sidewalls is between a 8 nm and 10 nm wider that a thickness of the narrower single crystal top surfaces and the narrower sidewalls.

In Example 18, the subject matter of Example 15 can optionally include wherein a thickness of the wide single crystal top surfaces and the wide sidewalls is between 10 nm and 30 nm, and a thickness of the narrower single crystal top surfaces and the narrower sidewalls is between 7 nm and 15 nm.

In Example 19, the subject matter of Example 15 can optionally be further comprising: a second single crystal material on the thinned top surfaces and thinned sidewalls to form clad electronic device fins, wherein the second single crystal material has a lattice spacing that is different than a lattice spacing of the first single crystal material.

In Example 20, the subject matter of Example 19 can optionally include wherein the first single crystal material is Silicon and the second single crystal material is SiGe, and wherein the second single crystal material comprises a thickness of between a 5 nm and 15 nm of the second single crystal material on the thinned top surface and the thinned sidewalls.

In Example 21, the subject matter of Example 16 can optionally include wherein a width of the clad electronic device fins is equal to or less than 20 nm wide.

In Example 22, the subject matter of Example 19 can optionally be further comprising a PMOS device formed from the clad electronic device fins, wherein the PMOS device comprises: a gate on the second single crystal material; and junction regions adjacent to the gate and in the second single crystal material.

Example 23 is a system for computing comprising: a microprocessor coupled to a memory, the microprocessor having at least one electronic device fin having: a narrower upper fin portion formed on and from a wide lower fin portion, the upper and lower portions formed from a substrate of a first single crystal material, the upper and lower portions formed under a first top surface area of the substrate; the wide lower fin portion having wide single crystal top surfaces and wide sidewalls between a first thickness of a trench oxide material in trenches formed between the first top surface areas; and the narrower upper fin portion having narrower single crystal top surfaces and narrower sidewalls with a same single crystal lattice as the wide single crystal top surfaces and the wide sidewalls, wherein the wide single crystal top surfaces and the wide sidewalls have a thickness of between a 1 nm and 15 nm greater than a thickness of the narrower single crystal top surfaces and the narrower sidewalls, the narrower upper fin portion exposed above the first thickness of a trench oxide material in the trenches.

In Example 24, the subject matter of Example 23 can optionally include wherein narrower top surfaces and the narrower sidewalls maintain the single crystal lattice structure of the wide single crystal top surfaces and wide sidewalls; and optionally further comprise: a second single crystal material on the thinned top surfaces and thinned sidewalls to form clad electronic device fins, wherein the second single crystal material has a lattice spacing that is different than a lattice spacing of the first single crystal material.

Example 25 is an apparatus comprising means for performing the method of any one of claims 1-14.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming fins 507 of Si and fins 680 of Ge or SiGe, the descriptions and figures above can be applied to forming fins 507 and 680 of other material such as forming fins 507 of InP or InAlAs and fins 680 of InAlAs or InGaAs. Thus, the claims following the Detailed Description are hereby expressly incorporated into this Detailed Description, with each claim standing on its own as a separate embodiment of the invention.

The invention claimed is:

1. A method to form electronic device fins comprising:
   etching away a thickness of a substrate between first top surface areas of a substrate of a first single crystal material to form wide electronic device fins under the first top surface areas and to form trenches between the first top surface areas, the wide electronic device fins having wide single crystal top surfaces and wide sidewalls; then
   forming a first thickness of a trench oxide material in the trenches and below the first top surface areas; and then
   etching a thickness of the wide single crystal top surfaces and the wide sidewalls of the wide electronic device fins to form narrower electronic device fins from the wide fins, the narrower electronic device fins having narrower single crystal top surfaces and narrower sidewalls with a same single crystal lattice as the wide single crystal top surfaces and the wide sidewalls, wherein etching the thickness of the wide single crystal top surfaces and the wide sidewalls includes removing a thickness of between a 1 nm and 15 nm of the wide single crystal top surfaces and the wide sidewalls.

2. The method of claim 1, further comprising:
   after etching the thickness of the wide single crystal top surfaces and the wide sidewalls, without an air break of the treatment chamber, depositing a second single crystal material on the thinned top surfaces and thinned sidewalls to form clad electronic device fins, wherein the second single crystal material has a lattice spacing that is different than a lattice spacing of the first single crystal material.

3. The method of claim 1, further comprising:
   prior to etching away the thickness of the substrate, forming hardmask patterns on the first top surface areas of the single crystal substrate where top surfaces of the electronic device fins are desired; then
   after etching away the thickness of the substrate, removing the hardmasks; then
   depositing a second thickness of a trench oxide material in the trenches formed by etching away the thickness of the substrate between the first top surface areas; then
   polishing to remove a third thickness of the trench oxide material above the first top surface areas; and then
   prior to etching the thickness of the wide single crystal top surfaces and the wide sidewalls, etching away a fourth thickness of the trench oxide material in the trenches to expose the wide single crystal sidewalls of the wide electronic device fins and to form the first thickness of a trench oxide material.

4. The method of claim 1, wherein etching the wide top surfaces and the wide sidewalls comprises maintaining in the narrower single crystal top surfaces and narrower sidewalls, a single crystal lattice structure of the wide top surfaces and the wide sidewalls.

5. The method of claim 1, wherein etching the wide top surfaces and the wide sidewalls comprises one of (1) etching using chlorine based chemistry using low ion energy plasma processing, or (2) etching using thermal processing.

6. The method of claim 1, wherein etching the wide top surfaces and the wide sidewalls comprises etching using chlorine based chemistry and using less than 5 kW of radio frequency energy for between 10 and 40 seconds.

7. The method of claim 1, wherein etching the wide top surfaces and the wide sidewalls comprises etching using chlorine based chemistry and using less than 1 kW of radio frequency energy for between 10 and 40 seconds.

8. The method of claim 1, wherein etching the wide top surfaces and the wide sidewalls comprises etching using thermal processing and using less than 900 degrees Celsius heat in an epitaxial deposition chamber for between 30 and 120 seconds in presence of HCl.

9. The method of claim 1, wherein etching the wide top surfaces and the wide sidewalls comprises etching using thermal processing and using less than 700 degrees Celsius heat in an epitaxial deposition chamber for between 30 and 120 seconds in presence of $Cl_2$.

10. The method of claim 1, wherein etching the thickness of the wide single crystal top surfaces and the wide sidewalls includes one of: (1) removing a thickness of between a 8 nm and 10 nm of the wide single crystal top surfaces and the wide sidewalls, or (2) forming the etched fins by trimming a width of the wide fins from greater than 10 nm to 30 nm to a width of the narrower fins of less than 7 nm to 15 nm.

11. The method of claim 1, further comprising:
   after etching the thickness of the wide single crystal top surfaces and the wide sidewalls, without an air break of the treatment chamber, depositing a second single crystal material on the thinned top surfaces and thinned sidewalls to form clad electronic device fins, wherein the second single crystal material has a lattice spacing that is different than a lattice spacing of the first single crystal material.

12. The method of claim 11, wherein the first single crystal material is Silicon and the second single crystal material is SiGe, and wherein depositing the second single crystal material comprises depositing a thickness of between a 5 nm and 15 nm of the second single crystal material on the thinned top surface and the thinned sidewalls.

13. The method of claim 11, wherein a width of the clad electronic device fins is equal to or less than 20 nm wide.

14. The method of claim 11, further comprising forming a PMOS device from the clad electronic device fins, wherein forming the PMOS device comprises:
   forming a gate on the second single crystal material; and
   forming junction regions adjacent to the gate and in the second single crystal material.

* * * * *